(12) United States Patent
Kamada et al.

(10) Patent No.: US 10,174,247 B2
(45) Date of Patent: Jan. 8, 2019

(54) ILLUMINANT AND RADIATION DETECTOR

(71) Applicants: TOHOKU TECHNO ARCH CO., LTD., Sendai-shi, Miyagi (JP); C & A Corporation, Sendai-shi, Miyagi (JP)

(72) Inventors: Kei Kamada, Sendai (JP); Akira Yoshikawa, Sendai (JP); Yuui Yokota, Sendai (JP); Shunsuke Kurosawa, Sendai (JP); Yasuhiro Shoji, Sendai (JP)

(73) Assignees: TOHOKU TECHNO ARCH CO., LTD., Sendai-shi (JP); C & A CORPORATION, Sendai-shi (JP)

( * ) Notice: Subject to any disclaimer, the term of this patent is extended or adjusted under 35 U.S.C. 154(b) by 100 days.

(21) Appl. No.: 15/305,563

(22) PCT Filed: Apr. 30, 2015

(86) PCT No.: PCT/JP2015/063032
§ 371 (c)(1),
(2) Date: Oct. 20, 2016

(87) PCT Pub. No.: WO2015/166999
PCT Pub. Date: Nov. 5, 2015

(65) Prior Publication Data
US 2017/0044433 A1   Feb. 16, 2017

(30) Foreign Application Priority Data

May 1, 2014   (JP) .................. 2014-094377
Nov. 6, 2014  (JP) .................. 2014-225932
Apr. 9, 2015  (JP) .................. 2015-079858

(51) Int. Cl.
*C09K 11/77*  (2006.01)
*C09K 11/00*  (2006.01)
(Continued)

(52) U.S. Cl.
CPC .......... *C09K 11/7774* (2013.01); *C09K 11/00* (2013.01); *C09K 11/77* (2013.01);
(Continued)

(58) Field of Classification Search
None
See application file for complete search history.

(56) References Cited

U.S. PATENT DOCUMENTS 4,783,596 A   11/1988  Riedner et al.
7,713,441 B2   5/2010  Shimomura et al.
(Continued)

FOREIGN PATENT DOCUMENTS

CN   1733865 A    2/2006
CN   101962547 A  2/2011
(Continued)

OTHER PUBLICATIONS

Kamada et al. "Composition Engineering in Cerium-Doped (Lu,Gd)3(Ga,Al)5O12 Single-Crystal Scintillators", Crystal Growth & Design, vol. 11. pp. 4484-4490, 2011.
(Continued)

*Primary Examiner* — Edwin Gunberg
(74) *Attorney, Agent, or Firm* — Oliff PLC (57) ABSTRACT

An illuminant has a short fluorescence lifetime, high transparency, and high light yield and a radiation detector uses the illuminant. The illuminant is appropriate for a radiation detector for detecting gamma-rays, X-rays, α-rays, and neutron rays, and has high radiation resistance, a short fluorescence decay time and high emission intensity. The illuminant has a garnet structure using emission from the 4f5d level of $Ce^{3+}$, and includes a garnet illuminant prepared by co-doping of at least one type of monovalent or divalent cation at a molar ratio of 7000 ppm or less with respect to all cations, to an illuminant having a garnet structure rep-
(Continued)

resented by general formula $Ce_xRE_{3-x}M_{5+y}O_{12+3y/2}$ (where $0.0001 \le x \le 0.3$, $0 \le y \le 0.5$ or $0 \le y \le -0.5$, M is one type or two or more types selected from Al, Lu, Ga, and Sc, and RE is one type or two or more types selected from La, Pr, Gd, Tb, Yb, Y, and Lu).

11 Claims, 2 Drawing Sheets

(51) Int. Cl.
> G01T 1/20 (2006.01)
> G01T 3/06 (2006.01)
> H01L 31/08 (2006.01)
> G01T 1/202 (2006.01)
> C30B 15/00 (2006.01)
> C30B 29/28 (2006.01)

(52) U.S. Cl.
> CPC ............ *C30B 15/00* (2013.01); *C30B 29/28* (2013.01); *G01T 1/20* (2013.01); *G01T 1/202* (2013.01); *G01T 3/06* (2013.01); *H01L 31/08* (2013.01); *H01L 31/085* (2013.01)

(56) References Cited

U.S. PATENT DOCUMENTS

| | | | |
|---|---|---|---|
| 2005/0242329 | A1 | 11/2005 | Fiedler et al. |
| 2007/0257596 | A1 | 11/2007 | Shimomura et al. |
| 2008/0017802 | A1 | 1/2008 | Nakamura et al. |
| 2008/0299027 | A1* | 12/2008 | Kurata .................. C30B 15/00 423/263 |
| 2010/0213817 | A1 | 8/2010 | Shimomura et al. |
| 2013/0069007 | A1* | 3/2013 | Miyagawa ......... C09K 11/7774 252/301.6 R |
| 2013/0270482 | A1 | 10/2013 | Jiang et al. |
| 2014/0134437 | A1 | 5/2014 | Arkhipov et al. |
| 2015/0008818 | A1 | 1/2015 | Miyagawa et al. |

FOREIGN PATENT DOCUMENTS

| | | |
|---|---|---|
| CN | 102220131 A | 10/2011 |
| JP | S64-54092 A | 3/1989 |
| JP | H07-41760 A | 2/1995 |
| JP | H09-110600 A | 4/1997 |
| JP | H10-293180 A | 11/1998 |
| JP | 2006-321974 A | 11/2006 |
| JP | 2007-515527 A | 6/2007 |
| JP | 2013-028667 A | 2/2013 |
| JP | 2013-043960 A | 3/2013 |
| KR | 20030078122 A | 10/2003 |
| WO | 2006/068130 A1 | 6/2006 |
| WO | 2011/014091 A1 | 2/2011 |
| WO | 2012/105202 A1 | 8/2012 |
| WO | 2013/025713 A1 | 2/2013 |

OTHER PUBLICATIONS

Kamada et al. "Cz Grown 2-in. Size Ce:Gd3(Al,Ga)5O12 Single Crystal; Relationship Between Al, Ga Site Occupancy and Scintillation Properties", Optical Materials, vol. 36, pp. 1942-1945, 2014.
Aug. 11, 2015 International Search Report issued in International Patent Application No. PCT/JP2015/063032.
Nikl et al., "The Antisite LuAl Defect-Related Trap in Lu3Al5O12: Ce Single Crystal", Physical Status Solidi, vol. 242, No. 14, pp. R119-R121, 2005.
Tyagi et al., "Effect of Codoping on Scintillation and Optical Properties of a Ce-Doped Gd3Ga3Al2O12 Scintillator", Journal of Physics D: Applied Physics, vol. 46, pp. 1-12, 2013.
Mar. 13, 2017 Extended European Search Report issued in European Patent Application No. 15785582.6.
Wisniewski et al. "Excited State Absorption and Thermoluminescence in Ce and Mg Doped Yttrium Aluminum Garnet", Acta Physica Polonica: Series A, vol. 95, No. 3, pp. 403-412, 1999.
Nov. 1, 2016 International Preliminary Report on Patentanbility issued in International Patent Application No. PCT/JP2015/063032.
Feb. 28, 2018 Office Action issued in European Application No. 15 785 582.6.
Mar. 29, 2018 Office Action issued in Russian Application No. 2016146155/05.
English Translation of Feb. 24, 2018 Office Action issued in Chinese Application No. 201580022146.9.
Zhao et al., "The effect of doping Sr2+ on enhancement of red emission of Y2.78-xSrxGd0.1Al5O12: 0.06 Ce3+ phosphors", Chinese Journal of Luminescence, 32(11), pp. 1099-1103 (2011).

\* cited by examiner

ILLUMINANT AND RADIATION DETECTOR

TECHNICAL FIELD

The present invention relates to an illuminant containing cerium as an activator for absorbing radiation such as gamma-rays, X-rays, α-rays, β-rays, and neutron rays and high-energy photons, so as to rapidly convert them into photons with lower energy. The present invention further relates to photon detectors or radiation detectors using the illuminant.

BACKGROUND ART

Illuminants such as scintillators are used for photon detectors or radiation detectors for detecting gamma-rays, X-rays, α-rays, β-rays, neutron rays and the like. These detectors are widely applied to positron emission tomographs (PET), medical imaging apparatuses such as X-ray CT, various radiation counters for high energy physics, and resource exploration devices, for example.

For example, in the case of a positron emission tomograph (PET), a gamma-ray (annihilation gamma ray: 511 eV) with relatively high energy is detected by coincidence counting, so that a scintillation detector having high sensitivity and exerting a quick response has been employed. Detectors are required to have properties including a high count rate and a high time resolution for removal of noise from random coincidence counting.

Moreover, in recent years, PET called Time-of-flight PET (TOF-PET) has emerged, which involves measuring differences in time required for an annihilation gamma ray to reach a radiation detector, so as to improve the position detection accuracy. A radiation detector to be used for TOF-PET is required to have particularly a quick response, and an important feature of a scintillator to be used for a radiation detector is its short fluorescence lifetime.

In general, a scintillator suitable for these radiation detectors is desired to be a crystal having high density and a large atomic number (high photoelectric absorption ratio) in terms of detection efficiency, and a high light yield, a short fluorescence lifetime (fluorescence decay time) and high transparency in terms of the need for quick response and high energy resolution. A recent system requires a large amount of scintillators to be densely aligned into a long slender shape (e.g., about 5×30 mm for PET) for multi-layering and increasing resolution. Hence, easy handling, workability, capability of preparing a large-sized crystal, and the price are also important factors for selection. In addition, it is also important that the emission wavelength of a scintillator is consistent with the high wavelength range of detection sensitivity of a photodetector.

Recently, a preferable scintillator to be applied to various radiation detectors is a scintillator having a garnet structure. For example, a scintillator having a garnet structure in which emission from the 4f5d level of $Ce^{3+}$ is used; that is, a Ce-doped $(Gd, Y, Lu)_3(Al, Ga)_5O_{12}$ crystal, has been reported (for example, see Patent Document 1 or Non-patent Document 1). It has been confirmed for Ce-doped $(Gd, Y, Lu)_3(Al, Ga)_5O_{12}$ that the scintillation properties including density, light yield, and fluorescence lifetime are varied depending on the crystal composition. In particular, a Ce-doped $Gd_3Al_2Ga_3O_{12}$ scintillator has properties including the density of 6.7 $g/cm^3$ and the light yield of 45000 photons/MeV, and has sufficiently low self-radioactivity, and thus is increasingly applied not only to PET, but also to medical imaging apparatuses such as X-ray CT, various radiation counters for high energy physics, and environmental radiation meters. In the meantime, the relevant scintillator is problematic in its long fluorescence lifetime of about 90 ns.

Moreover, a scintillator containing Gd, Al, and Ga wherein the ratio of the number of atoms Ga/(Gd+Ga+Al+Ce) ranges from 0.2 to 0.3 has been reported (for example, see Patent Document 2). However, when the ratio of the number of atoms Ga/(Gd+Ga+Al+Ce) is 0.3 or less, a Ce-doped $Gd_3(Al, Ga)_5O_{12}$ scintillator with the highest performance among Ce-activated garnet scintillators is impossible to achieve single crystal growth by melt growth. Therefore, it is difficult to apply the Ce-doped $Gd_3(Al, Ga)_5O_{12}$ scintillator to PET for which a highly transparent large-sized crystal is necessary and high energy physics applications (for example, see Non-patent Document 2).

A garnet scintillator is known to have a crystal structure with 3 sites that are 8-coordinated, 6-coordinated, and 4-coordinated sites. For example, a Ce-doped $(Gd, Y, Lu)_3(Al, Ga)_5O_{12}$ garnet scintillator is known such that rare-earth elements, Ce, Gd, Y, and Lu, occupy an 8-coordinated site, and Al and Ga occupy 6-coordinated and 4-coordinated sites. However, it is known for Ce-activated garnet scintillators that the anti-site phenomenon takes place involving partial replacement by rare-earth elements in 6-coordinated and 4-coordinated sites, and partial replacement by Al and Ga in the 8-coordinated site, resulting in the generation of an anti-site-derived defect level between band gaps, $Ce^{3+}$ 4f5d emission inhibited by the defect level, a lowered light yield, and the generation of a long-life emission component (for example, see Non-patent Document 3).

PRIOR ART DOCUMENTS

Patent Documents

Patent Document 1 International Publication WO2012/105202
Patent Document 2 International Publication WO2006/068130

Non-Patent Documents

Non-patent Document 1 Kamada K, Yanagida T, Pejchal J, Nikl N, Endo T, Tsutumi K, Fujimoto Y, Fukabori A and Yoshikawa A., "Composition Engineering in Cerium-Doped $(Lu,Gd)_3(Ga,Al)_5O_{12}$ Single-Crystal Scintillators", Crystal Growth and Design, 2011, 11, 4484

Non-patent Document 2 Kei Kamada, Shunsuke Kurosawa, Petr Prusa, Martin Nikl, Vladimir V. Kochurikhin, Takanori Endo, Kousuke Tsutumi, Hiroki Sato, Yuui Yokota, Kazumasa Sugiyama, Akira Yoshikawa, "Cz grown 2-in. size $Ce:Gd_3(Al,Ga)_5O_{12}$ single crystal; relationship between Al, Ga site occupancy and scintillation properties", Optical Materials, October 2014, Volume 36, Issue 12, Pages 1942-1945

Non-patent Document 3 M. Nikl, E. Mihokova, J. Pejchal, A. Vedda, Yu. Zorenko, and K. Nejezchleb, "The antisite $Lu_{Al}$ defect-related trap in $Lu_3Al_5O_{12}:Ce$ single crystal", physica status solidi (b), November 2005, Volume 242, Issue 14, Pages R119-R121

SUMMARY OF THE INVENTION

Problem to be Solved by the Invention

As described above, scintillators having a conventional Ce-doped garnet structure are problematic in their long fluorescence lifetime, low transparency, and low light yield.

The present invention has been completed in view of such problems, and an object of the present invention is to provide an illuminant having a short fluorescence lifetime, high transparency, and a high light yield and a radiation detector using such illuminant. Accordingly, an illuminant, which is suitable for radiation detectors for detecting radiation such as gamma-rays, X-rays, α-rays, and neutron rays, has a short fluorescence decay time and high emission intensity, and a radiation detector using the illuminant can be provided.

Means for Solving the Problem

The present invention has the following features in order to achieve the above object.

Specifically, a first illuminant according to the present invention such as a scintillator and a phosphor is characterized by including a garnet illuminant prepared by co-doping of at least one type of monovalent or divalent cation at a molar ratio of 7000 ppm or less with respect to all cations, to an illuminant having a garnet structure represented by general formula $Ce_xRE_{3-x}M_{5+y}O_{12+3y/2}$ (where $0.0001 \leq x \leq 0.3$, $0 \leq y \leq 0.5$ or $0 \leq y \leq -0.5$, M is one type or two or more types selected from Al, Lu, Ga, and Sc, and RE is one type or two or more types selected from La, Pr, Gd, Tb, Yb, Y, and Lu).

Furthermore, a second illuminant according to the present invention is characterized by including a garnet illuminant prepared by co-doping of Li at a molar ratio of 7000 ppm or less with respect to all cations, to an illuminant having a garnet structure represented by general formula $Ce_xRE_{3-x}M_{5+y}O_{12+3y/2}$ (where $0.0001 \leq x \leq 0.3$, $0 \leq y \leq 0.5$ or $0 \leq y \leq -0.5$ or M is one type or two or more types selected from Al, Lu, Ga, and Sc, and RE is one type or two or more types selected from La, Pr, Gd, Tb, Yb, Y, and Lu).

Furthermore, a second illuminant according to the present invention may be an illuminant characterized by including a garnet illuminant prepared by co-doping of Mg at a molar ratio of 7000 ppm or less with respect to all cations, to an illuminant having a garnet structure represented by general formula $Ce_xRE_{3-x}M_{5+y}O_{12+3y/2}$ (where $0.0001 \leq x \leq 0.3$, $0 < y \leq 0.5$ or $0 < y \leq -0.5$, and RE is one type or two or more types selected from Y and Lu).

Furthermore, the second illuminant according to the present invention may be an illuminant characterized by including a garnet illuminant prepared by co-doping of Li or Mg at a molar ratio of 7000 ppm or less with respect to all cations, to an illuminant having a garnet structure represented by general formula $Ce_xGd_{3-x}(Ga_zAl_{1-z})_{5+y}O_{12+3y/2}$ (where $0.0001 \leq x \leq 0.3$, $0 < y \leq 0.5$ or $0 < y \leq -0.5$, $0.49 \leq z \leq 0.7$).

Furthermore, the second illuminant according to the present invention is obtained by heating a raw material at 1000° C. or higher, has a light yield of 20000 photons/MeV or more and a time resolution of 300 ps or less, and a 0.5% or less phosphorescence component, and may be composed of a transparent body with a diffuse transmittance of 80% or more. The raw material is a compound containing Ce, RE (e.g., Gd), and M (e.g., Ga and Al).

Furthermore, a third illuminant according to the present invention, such as a scintillator and a phosphor is characterized by including a garnet illuminant prepared by co-doping of at least one type of monovalent or divalent cation at a molar ratio of 7000 ppm or less with respect to all cations, to an illuminant having a garnet structure represented by general formula $Gd_{3-x-z}Ce_xRE_zM_5O_{12}$ (where $0.0001 \leq x \leq 0.1$, $0 \leq z < 3$, M is one type or two more types selected from Al, Lu, Ga, and Sc, and RE is one type or two or more types selected from La, Pr, Tb, Yb, Y, and Lu).

Furthermore, the third illuminant according to the present invention is an illuminant having a garnet structure in which emission from the 4f5d level of $Ce^{3+}$ is used, and may be an illuminant characterized by including a garnet illuminant prepared by co-doping of at least one type of monovalent or divalent cation at a molar ratio of 7000 ppm or less with respect to all cations, to an illuminant having a garnet structure represented by general formula $Gd_{3-x-z}Ce_xRE_zM_{5+y}O_{12+3y/2}$ (where $0.0001 \leq x \leq 0.1$, $0 < y < 0.5$ or $0 < y < -0.5$, $0 \leq z < 3$, M is one type or two or more types selected from Al, Lu, Ga, and Sc, and RE is one type or two or more types selected from La, Pr, Tb, Yb, Y, and Lu).

Regarding the third illuminant according to the present invention, the above divalent cation to be used for co-doping is preferably at least one type selected from Mg and Ca, and Mg is most preferred.

Furthermore, the third illuminant according to the present invention is obtained by heating a raw material at 1000° C. or higher, and may be composed of a transparent body having a light yield of 40000 photons/MeV or more and a time resolution of 240 ps or less. The raw material is a compound containing Gd, Ce, M (e.g., Al and Ga), and monovalent or divalent cations, and if necessary, RE.

The first to the third illuminants according to the present invention may have fluorescence wavelengths ranging from 200 nm to 600 nm, resulting from excitation by radiation such as gamma-rays or by high-energy photons.

The first to third illuminants according to the present invention using emission from the 4f5d level of $Ce^{3+}$ are prepared by co-doping of at least one type of Li and Mg, for example, selected from monovalent alkali metal ions including Li, Na, K, Rb, and Cs and divalent alkaline-earth metal ions including Be, Mg, Ca, Sr, and Ba at a molar ratio of 7000 ppm or less with respect to all cations. Therefore, compared to non-co-doped illuminants, the first to third illuminants have a fluorescence decay time shorter by 5% or more and a rise time of emission enhanced by 5% or more, emission intensity increased by 5% or more, so that sampling time can be short for fluorescence measurement, and a high time resolution; that is, reduced sampling intervals can be expected. The thus realized high time resolution enables to increase the number of sampling per unit time. Moreover, an increase in emission intensity improves energy resolution. Radiation resistance is also improved.

The first to third cerium-activated illuminants according to the present invention are desired to contain at least one type of Li and Mg, for example, selected from monovalent alkali metal ions including Li, Na, K, Rb, and Cs and divalent alkaline-earth metal ions including Be, Mg, Ca, Sr, and Ba at a molar ratio of 1 ppm or more and 7000 ppm or less, preferably a molar ratio of 5 ppm or more and 6000 ppm or less, more preferably a molar ratio of 10 ppm or more and 5000 ppm or less, and further more preferably a molar ratio of 20 ppm or more and 400 ppm or less with respect to all cations.

The first to third illuminants according to the present invention are desired to have high transparency in view of high light yield, high time resolution, and high energy resolution required. Preferably, the first to third illuminants are desired to have a diffuse transmittance of 70% or more per cm, more preferably a diffuse transmittance of 85% or more per cm, further more preferably a diffuse transmittance of 95% or more per cm of emission wavelength.

The time resolution of the first to third illuminants according to the present invention can be improved by co-doping of monovalent or divalent cations such as Li and Mg. When the size is φ3×3 mm, through the use of a coincidence method that involves irradiation with a 511-keV gamma-ray, the second illuminant according to the present invention having a time resolution of 240 ps or less, and the third illuminant according to the present invention having a time resolution of 300 ps or less can be obtained. In addition, in general, it is known that the larger the illuminant size, the longer the optical path required for light to reach a photodetector, resulting in a deteriorated time resolution.

In general, a light yield correlates with the integral value of a voltage pulse signal, so that the higher the emission intensity, the higher the light yield, and the shorter the rise time of emission and the fluorescence lifetime, the lower the light yield. When the first to third illuminants according to the present invention are used for PET, for example, the light yield is desired to be higher than that of LYSO that is an existing scintillator for PET, preferably 24000 photons/MeV or higher, more preferably 30000 photons/MeV or higher, and further more preferably 40000 photons/MeV or higher.

A scintillator crystal composed of the first to third illuminants according to the present invention having such short-lived emission is expected to be used as a scintillator for quick-response radiation detection for TOF-PET, PET, SPECT, and CT, and is also expected to be applied to various radiation counters for high energy physics and environmental radiation meters.

A fourth illuminant according to the present invention such as a scintillator and a phosphor is characterized by having a garnet structure represented by general formula $Ce_xRE_{3-x}M_{5+y}O_{12+3y/2}$ (where $0.0001 \leq x \leq 0.3$, $0 < y \leq 0.5$ or $0 < y \leq -0.5$, M is one type or two or more types selected from Al, Lu, Ga, and Sc, and RE is one type or two or more types selected from La, Pr, Gd, Tb, Yb, Y, and Lu). In this case, compared to phosphor with y=0 or 1, the illuminant has a short fluorescence decay time, a short rise time of emission, high emission intensity, high radiation resistance, a high light yield, and few phosphorescence components.

In a production method for the illuminants according to the present invention including the first to fourth illuminants according to the present invention, general oxides as raw materials can be used as starting raw materials. However, when used for a scintillator crystal, raw materials with high purities of 99.99% or more (4N or more) are particularly preferably used. Upon production, these starting raw materials are weighed and mixed to have a target composition when melt formation is used. Furthermore, these raw materials containing extremely low contents of impurities (e.g., 1 ppm or less) other than those of the target composition are particularly preferred.

In a production method for the first to fourth illuminants according to the present invention, crystal growth is preferably performed under an inert gas (e.g., Ar, $N_2$, and He) atmosphere. A mixed gas of an inert gas (e.g., Ar, $N_2$, and He) and an oxygen gas, a carbonic acid gas, or a carbon monoxide gas may be used. However, when crystal growth is performed using such a mixed gas, in order to prevent oxidation of a crucible, an oxygen partial pressure is preferably 2% or less. In addition, in downstream steps such as annealing after crystal growth, an oxygen gas, a carbonic acid gas, a carbon monoxide gas, or an inert gas (e.g., Ar, $N_2$, and He), and a mixed gas of an inert gas (e.g., Ar, $N_2$, and He) and an oxygen gas, a carbonic acid gas, or a carbon monoxide gas can be used. When a mixed gas is used, an oxygen partial pressure is not limited to 2%, and a mixed gas with any percentage of mixture ranging from 0% to 100% may also be used.

The first to fourth illuminants according to the present invention is desirably produced by heating raw materials at 1000° C. or higher. For example, in addition to a micro-pulling down method that is a melt growth method involving heat treatment at the melting point of an illuminant or higher temperatures, a liquid-phase method such as Czochralski process (pulling-up method), Bridgman technique, a zone melting method (zone melt method) or an edge-defined film-fed growth method (EFG method), a flux method involving production by heat treatment at 1000° C. or higher, a solution growth method such as a top seeded solution growth (TSSG) method, and a sintering method such as an atmosphere sintering method, a reaction sintering method, and a hot isostatic press sintering method can be employed without particular limitation. However, in order to improve yields and to relatively reduce the process loss, Czochralski process or Bridgman technique is preferably performed to obtain a large-sized crystal. Moreover, when a sintering method such as an atmosphere sintering method, a reaction sintering method, or a hot isostatic press sintering method is employed, heat treatment is more preferably performed at a temperature of 1300° C. or higher and at a temperature of the melting point or lower.

On the other hand, since no or few downstream processes are required when only a small-sized crystal is used as a scintillator crystal, solution-phase methods such as a zone melting method, an EFG method, a micro-pulling down method, and Czochralski process, and sintering methods such as an atmosphere sintering method, a reaction sintering method, and a hot isostatic press sintering method are preferred.

Moreover, as a crucible or an after-heater to be used for these heat treatments, the one composed of platinum, iridium, rhodium, rhenium, tungsten, molybdenum or an alloy thereof can be used. Also, not only a high-frequency oscillator, but also a light-condensing heater and a resistance heater can be used for heating.

In order to make the fluorescence lifetime shorter, and to reduce components with a long fluorescence lifetime, a fifth illuminant according to the present invention is characterized in that it is produced, after production of the first to fourth illuminants according to the present invention, by annealing at 1000° C. or higher in an atmosphere containing oxygen, in an atmosphere containing an inert gas (e.g., argon and nitrogen), in an atmosphere containing oxygen with respect to an inert gas such as argon and nitrogen, or in air. Annealing is desirably performed in a temperature range of 1000° C. or higher for 8 or more hours. Annealing is desirably performed preferably in a temperature range of 1300° C. or higher for 12 or more hours, more preferably in a temperature range of 1500° C. or higher for 12 or more hours, and further more preferably in a temperature range of 1600° C. or higher for 24 or more hours.

In general, mirror polishing via mechanical polishing is required to improve the emission intensity, the light yield, the time resolution, and the energy resolution of an illuminant. A method of mechanical polishing involves a plurality of steps including a rough grinding step, a mirror polishing step, and the like and thus is complicated. When a plurality of surfaces of particularly a polyhedron are polished, polishing of each surface is required generally and is uneconomical. Moreover, polishing non-plain complicated surfaces is generally difficult. Hence, the illuminants according to the present invention including the first to fifth illuminants according to the present invention are desired to have etch pits on the surfaces and nonglossy surfaces having normal incidence reflectivity of 8% or lower as a result of etching treatment that involves immersing the illuminants prepared by the above production method in an etchant containing phosphoric acid such as orthophosphoric acid in order to increase the emission intensity and the light yield, and to improve the time resolution. The normal incidence reflectivity is desired to be preferably higher than 0 and 7% or lower, more preferably higher than 0 and 5% or lower, further preferably 0.05 or higher and 2% or lower. In addition, an etchant that may be used herein is prepared by mixing orthophosphoric acid with at least one type of sulfuric acid, hydrochloric acid, or nitric acid. The etchant is desired to be heated at 100° C. or higher. The emission intensity, the light yield, the time resolution, and the energy resolution can be improved by the etching treatment as compared to a mirror polishing method involving mechanical polishing.

The first to fifth illuminants according to the present invention are preferably single crystals.

A radiation detector according to the present invention is a radiation detector having: illuminants that absorb radiation including γ-rays, X-rays, α-rays, and neutron rays and high energy photons, so as to emit light; and a photoreceiver that detects light emission from the illuminant, wherein the illuminants are characterized by being the first to fifth illuminants according to the present invention.

Effect of the Invention

According to the present invention, an illuminant having a short fluorescence lifetime, high transparency, and a high light yield, and a radiation detector using the illuminant can be provided. Therefore, illuminants, which are suitable for detectors for detecting radiation including gamma-rays, X-rays, α-rays, neutron rays, and have high radiation resistance, a short fluorescence decay time and high emission intensity, and radiation detectors using such illuminants can be provided.

MODES FOR CARRYING OUT THE INVENTION

The embodiments of the present invention are described as follows.

The illuminants of the embodiments of the present invention include a garnet illuminant prepared by co-doping of at least one type of monovalent or divalent cation at a molar ratio of 7000 ppm or less with respect to all cations, to an illuminant having a garnet structure represented by general formula $Ce_xRE_{3-x}M_{5+y}O_{12+3y/2}$ (where $0.0001 \leq x \leq 0.3$, $0 \leq y \leq 0.5$ or $0 \leq y \leq -0.5$, M is one type or two or more types selected from Al, Lu, Ga, and Sc, and RE is one type or two or more types selected from La, Pr, Gd, Tb, Yb, Y, and Lu).

The illuminants of the embodiments of the present invention have short fluorescence decay times, short rise times of emission, high emission intensity, high radiation resistance, high light yields, and few phosphorescence components.

Among the illuminants of the embodiments of the present invention, the first illuminant of the embodiments of the present invention is an illuminant having a garnet structure in which emission from the 4f5d level of $Ce^{3+}$ is used, and includes a garnet illuminant prepared by co-doping of Li at a molar ratio of 7000 ppm or less with respect to all cations, to a illuminant having a garnet structure represented by general formula $Ce_xRE_{3-x}M_{5+y}O_{12+3y/2}$ (where $0.0001 \leq x \leq 0.3$, $0 \leq y \leq 0.5$ or $0 \leq y \leq -0.5$, M is one type or two or more types selected from Al, Lu, Ga, and Sc, and RE is one type or two or more types selected from La, Pr, Gd, Tb, Yb, Y, and Lu).

Furthermore, the second illuminant of the embodiments of the present invention is an illuminant having a garnet structure in which emission from the 4f5d level of $Ce^{3+}$ is used, and has a garnet structure represented by general formula $Ce_xRE_{3-x}M_{5+y}O_{12+3y/2}$ (where $0.0001 \leq x \leq 0.3$, $0 < y \leq 0.5$ or $0 < y \leq -0.5$, M is one type or two or more types selected from Al, Lu, Ga, Sc, and RE is one type or two or more types selected from La, Pr, Gd, Tb, Yb, Y, and Lu). In this case, in particular, compared to phosphor with y=0 or 1, the illuminant has a short fluorescence decay time, a short rise time of emission, high emission intensity, high radiation resistance, a high light yield, and few phosphorescence components.

Furthermore, the third illuminant of the embodiments of the present invention is an illuminant having a garnet structure in which emission from the 4f5d level of $Ce^{3+}$ is used, and includes a garnet illuminant prepared by co-doping of at least one type of monovalent or divalent cation at a molar ratio of 7000 ppm or less with respect to all cations, to an illuminant having a garnet structure represented by general formula $Gd_{3-x-z}Ce_xRE_zM_5O_{12}$ (where $0.0001 \leq x \leq 0.1$, $0 \leq z < 3$, M is one type or two or more types selected from Al, Lu, Ga, and Sc, and RE is one type or two or more types selected from La, Pr, Tb, Yb, Y, and Lu).

Furthermore, the fourth illuminant of the embodiments of the present invention is an illuminant having a garnet structure in which emission from the 4f5d level of $Ce^{3+}$ is used, and includes a garnet illuminant prepared by co-doping of at least one type of monovalent or divalent cation at a molar ratio of 7000 ppm or less with respect to all cations, to an illuminant having a garnet structure represented by general formula $Gd_{3-x-z}Ce_xRE_zM_{5+y}O_{12+3y/2}$ (where $0.0001 \leq x \leq 0.1$, $0 < y < 0.5$ or $0 < y < -0.5$, $0 \leq z < 3$, M is one type or two or more types selected from Al, Lu, Ga, and Sc, and RE is one type or two or more types selected from La, Pr, Tb, Yb, Y, and Lu).

The illuminants of the embodiments of the present invention are produced by a method for producing single crystals using a micro-pulling down method, for example. In addition, a micro-pulling down method is described as a method for producing the illuminants of the embodiments of the present invention, but the production method is not limited thereto.

The micro-pulling down method is performed using a controlled atmosphere micro-pulling down apparatus using high-frequency induction heating. The micro-pulling down apparatus is composed of single crystal production equipment provided with a crucible, a seed holder for holding a seed that is brought into contact with melt flowing out from pores provided on the bottom of the crucible, a moving mechanism for moving the seed holder downward, a moving speed control device of the moving mechanism, and a means for induction heating for heating the crucible. With the use of such single crystal production equipment, a single crystal can be prepared by forming solid-liquid interface immediately below the crucible and then moving the seed crystal downward.

The crucible is composed of carbon, platinum, iridium, rhodium, rhenium, tungsten, molybdenum or an alloy thereof, wherein an after heater, that is a heating element made of carbon, platinum, iridium, rhodium, rhenium, tungsten, molybdenum, or an alloy thereof is arranged on the periphery of the bottom of the crucible. The crucible and the after heater allow the adjustment of a heating value by power conditioning of a means for induction heating, so as to enable the control of the temperature and the distribution of a solid-liquid interface region of the melt that is pulled out from pores provided on the bottom of the crucible.

The chamber material is SUS and the material for the aperture is quartz. The micro-pulling down apparatus enables controlled atmosphere, and thus is provided with a rotary pump and is configured to be able to regulate the degree of vacuum at $1\times10^{-3}$ Torr or less before gas substitution. The apparatus is also configured so that Ar, $N_2$, $H_2$, and $O_2$ gases, for example, can be introduced into the chamber at a flow rate precisely adjusted by an accompanying gas flow meter.

The use of this apparatus involves introducing raw materials weighed and mixed to a target composition at the time of melt formation into the crucible, evacuating the furnace via high-vacuum evacuation, introducing an Ar gas or a mixed gas of an Ar gas and an $O_2$ gas into the furnace, so as to create an inert gas atmosphere or an atmosphere with low oxygen partial pressure within the furnace, gradually applying high-frequency power to the means for induction heating, so as to heat the crucible, and then completely melting raw materials within the crucible. In addition, raw materials are preferably composed of at least a 99.99% (4N or more) high-purity raw material, and contain impurities other than those of the target composition in concentrations as low as possible (e.g., 1 ppm or less).

After melting raw materials, a seed crystal is gradually ascended at a predetermined rate, so that the tip is brought into contact with pores at the lower end of the crucible for the seed crystal to be sufficiently fitted to the pores. Subsequently, a pulling down shaft of a seed holder is descended while adjusting the temperature of the melt, thereby growing the crystal. In addition, a seed crystal that is preferably used herein has a structure and a composition equivalent to or similar to those of an object for crystal growth, but is not limited thereto. Moreover, a seed crystal with clear orientation is preferably used herein.

The time when the prepared raw materials are all crystallized and the melt disappears is regarded as the completion of crystal growth. In addition, an instrument for continuous charge of raw materials may be incorporated in order to keep the uniform composition and create a long size.

A radiation detector of the embodiments of the present invention is composed in combination of the illuminants of the embodiments of the present invention comprising a scintillator crystal and a photoreceiver. The radiation detectors of the embodiments of the present invention can also be used as radiation detectors for radiation inspecting apparatuses.

Examples of such a radiation inspecting apparatus include detectors for resource survey, detectors for high energy physics, environmental radioactivity detectors, gamma cameras, and medical image processing apparatuses. Examples of medical image processing apparatuses are appropriate for applications including a positron emission tomograph (PET), X-ray CT, and SPECT, for example. Preferred embodiments of PET include two-dimensional PET, three-dimensional PET, Time-of-Flight (TOF) PET, and depth of interaction (DOT) PET. Moreover, these PETs may be used in combination.

In the radiation detectors of the embodiments of the present invention, as a photoreceiver, a position sensitive photomultiplier tube (PS-PMT), a silicon photomultiplier (Si-PM) photodiode (PD), or an avalanche-photodiode (APD) can be used, for example.

Examples of the illuminants of the embodiments of the present invention are described in detail as follows with reference to drawings, but are not intended to limit the present invention. In addition, in the following examples, Ce and monovalent or divalent cations to be used for co-doping were specified with concentrations in crystal or concentrations in a melt (preparation), however, there was a relationship in each example such that the ratio of a concentration in a crystal to a concentration upon preparation is about 1:1-100.

Moreover, in each example, time resolution was measured as follows. First, a transparent illuminant in each example was processed and polished into a size of φ3×3 mm. Two illuminants of which were adhered using an optical adhesive to two Si-PMs arranged about 5 cm away and facing each other, and then surfaces other than adhesion surfaces were covered with Teflon (registered trademark) tape. Next, a $^{22}$N a gamma-ray source was installed at the center between the two scintillator single crystals (illuminants), so that each illuminant was irradiated with 511 keV gamma-rays simultaneously emitted from the $^{22}$N a gamma-ray source at an angle of about 180° as a result of β-ray decay. Fluorescence of each illuminant resulting from gamma-ray irradiation was measured by a coincidence method using a digital oscilloscope, thereby measuring a time resolution.

Example 1

According to a micro-pulling down method, garnet scintillator single crystals having a composition of $Gd_{2.985}Ce_{0.015}Ga_3Al_2O_{12}$ were prepared by co-doping of Li at 300, 1500, and 3000 ppm. These single crystals had a diameter of 3 mm and a length of 15 mm, and were yellowish transparent. Emission from the 4f5d level of $Ce^{3+}$ was confirmed at wavelengths in the vicinity of 520 nm. The diffuse transmittance at 520 nm was 91% per cm.

Example 2

According to the micro-pulling down method, garnet scintillator single crystals having a composition of $Lu_{2.985}Ce_{0.015}Al_5O_{12}$ were prepared by co-doping of Li at 300, 1500, and 3000 ppm. These single crystals had a diameter of about 3 mm and a length of about 15 mm, and were yellowish transparent. Emission from the 4f5d level of $Ce^{3+}$ was confirmed at wavelengths in the vicinity of 480 nm. The diffuse transmittance at 480 nm was 90% per cm.

Example 3

According to the micro-pulling down method, garnet scintillator single crystals having a composition of $Y_{2.985}Ce_{0.015}Al_5O_{12}$ were prepared by co-doping of Li at 300, 1500, and 3000 ppm. These single crystals had a diameter of about 3 mm and a length of about 15 mm, and were yellowish transparent. Emission from the 4f5d level of $Ce^{3+}$ was confirmed at wavelengths in the vicinity of 480 nm. The diffuse transmittance at 480 nm was 90% per cm.

Comparative Example 1

According to the micro-pulling down method, a non-co-doped garnet scintillator single crystal having a composition of $Gd_{2.985}Ce_{0.015}Ga_3Al_2O_{12}$ was prepared. The thus obtained single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm.

Comparative Example 2

According to the micro-pulling down method, a garnet scintillator single crystal having a composition of $Gd_{2.985}Ce_{0.015}Ga_3Al_2O_{12}$ was prepared by co-doping of Li at 20000 ppm. The thus obtained single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 70% per cm. The emission intensity decreased by 40% compared to the non-co-doped crystal of Comparative example 1.

Comparative Example 3

According to the micro-pulling down method, a non-co-doped garnet scintillator single crystal having a composition of $Lu_{2.985}Ce_{0.015}Al_5O_{12}$ was prepared. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 90% per cm.

Comparative Example 4

According to the micro-pulling down method, a non-co-doped garnet scintillator single crystal having a composition of $Y_{2.985}Ce_{0.015}Al_5O_{12}$ was prepared. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 90% per cm.

Example 4

According to the micro-pulling down method, a garnet scintillator single crystal having a composition of $Gd_{2.985}Ce_{0.015}Ga_{3.15}Al_{2.1}O_{12.375}$ was prepared by co-doping of Li at 300 ppm. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm.

Example 5

According to the micro-pulling down method, a garnet scintillator single crystal having a composition of $Gd_{2.985}Ce_{0.015}Ga_{2.85}Al_{1.9}O_{11.625}$ was prepared by co-doping of Li at 300 ppm. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 91% per cm.

Example 6

According to the micro-pulling down method, a garnet scintillator single crystal having a composition of $Gd_{2.985}Ce_{0.015}Ga_{3.15}Al_{2.1}O_{12.375}$ was prepared. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 91% per cm.

Example 7

According to the micro-pulling down method, a garnet scintillator single crystal having a composition of $Gd_{2.985}Ce_{0.015}Ga_{2.85}Al_{1.9}O_{11.625}$ was prepared. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 90% per cm.

Example 8

$Gd_{2.985}Ce_{0.015}Ga_3Al_2O_{12}$ co-doped with Li at 300 ppm of those in Example 1 was subjected to 24 hours of annealing in an argon atmosphere containing 3% oxygen within a temperature range of 1700° C.

Example 9

$Gd_{2.985}Ce_{0.015}Ga_{3.15}Al_{2.1}O_{12.375}$ in Example 6 was subjected to 24 hours of annealing in an argon atmosphere containing 3% oxygen within a temperature range of 1700° C.

Example 10

$Lu_{2.985}Ce_{0.015}Al_5O_{12}$ co-doped with Li at 300 ppm of those in Example 2 was subjected to 24 hours of annealing in air within a temperature range of 1200° C.

Comparative Example 5

$Gd_{2.985}Ce_{0.015}Ga_{3.15}Al_{2.1}O_{12.375}$ co-doped with Li at 300 ppm in Example 4 was subjected to 48 hours of annealing in an argon atmosphere containing 3% hydrogen within a temperature range of 1000° C.

Example 11

According to the micro-pulling down method, a garnet scintillator single crystal having a composition of $Lu_{2.985}Ce_{0.015}Al_{5.2}O_{12.3}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 90% per cm.

Example 12

According to the micro-pulling down method, a garnet scintillator single crystal having a composition of $Y_{2.985}Ce_{0.015}Al_{5.2}O_{12.3}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 91% per cm.

Example 13

According to the micro-pulling down method, a garnet scintillator single crystal having a composition of $Lu_{2.985}Ce_{0.015}Al_{4.8}O_{11.7}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 90% per cm.

Example 14

According to the micro-pulling down method, a garnet scintillator single crystal having a composition of $Y_{2.985}Ce_{0.015}Al_{4.8}O_{11.7}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 91% per cm.

Table 1 shows the results of evaluating crystals obtained in Examples 1 to 14 and Comparative examples 1 to 5 for emission intensity, rise time of emission, fluorescence lifetime, and time resolution. Light yields were each evaluated by processing and polishing the scintillator single crystals of examples and comparative examples to a size of φ3×1 mm, adhering each crystal piece to a photomultiplier tube using an optical adhesive, covering the top surface of which with Teflon (Trademark) tape, irradiating the surface with a $^{137}Cs$ gamma-ray, and then analyzing photoelectric absorption peaks of the thus obtained energy spectra.

TABLE 1

| | Host crystal composition | Co-doping level (ppm) | Peak emission wavelength (nm) | Emission intensity ratio for non-co-doped crystal | Rise time of emission (ns) | Fluorescence lifetime (ns) | Time resolution (ps) |
|---|---|---|---|---|---|---|---|
| Example 1 | $Gd_{2.985}Ce_{0.015}Ga_3Al_2O_{12}$ | Li 300 | 520 | 1.30 | 1.9 | 50(90)% 140(10)% | 240 |
| | | Li 1500 | 520 | 1.21 | 1.8 | 43(100)% | 210 |
| | | Li 3000 | 520 | 1.11 | 1.7 | 42(100)% | 190 |
| Example 2 | $Lu_{2.985}Ce_{0.015}Al_5O_{12}$ | Li 300 | 480 | 1.60 | 0.9 | 38(85)% 141(15)% | 230 |
| | | Li 1500 | 480 | 1.50 | 0.8 | 35(100)% | 220 |
| | | Li 3000 | 480 | 1.30 | 0.7 | 32(100)% | 210 |
| Example 3 | $Y_{2.985}Ce_{0.015}Al_5O_{12}$ | Li 300 | 480 | 1.50 | 1.0 | 36(86)% 155(14)% | 240 |
| | | Li 1500 | 480 | 1.44 | 0.9 | 36(100)% | 230 |
| | | Li 3000 | 480 | 1.11 | 0.9 | 31(100)% | 220 |
| Comparative example 1 | $Gd_{2.985}Ce_{0.015}Ga_3Al_2O_{12}$ | 0 | 520 | 1.00 | 2.3 | 64(75)% 248(25)% | 400 |
| Comparative example 2 | $Gd_{2.985}Ce_{0.015}Ga_3Al_2O_{12}$ | Li 20000 | 520 | 0.60 | 1.2 | 40(95)% 88(5)% | 540 |
| Comparative example 3 | $Lu_{2.985}Ce_{0.015}Al_5O_{12}$ | 0 | 480 | 1.00 | 1.2 | 50(70)% 254(30)% | 350 |
| Comparative example 4 | $Y_{2.985}Ce_{0.015}Al_5O_{12}$ | 0 | 480 | 1.00 | 1.2 | 45(70)% 233(30)% | 330 |
| Example 4 | $Gd_{2.985}Ce_{0.015}Ga_{3.15}Al_{2.1}O_{12.375}$ | Li 300 | 520 | 1.36 | 2.0 | 39(95)% 99(5)% | 170 |
| Example 5 | $Gd_{2.985}Ce_{0.015}Ga_{2.85}Al_{1.9}O_{11.625}$ | Li 300 | 520 | 1.34 | 2.0 | 40(97)% 110(3)% | 175 |
| Example 6 | $Gd_{2.985}Ce_{0.015}Ga_{3.15}Al_{2.1}O_{12.375}$ | 0 | 520 | 1.12 | 1.8 | 83(85)% 199(15)% | 390 |
| Example 7 | $Gd_{2.985}Ce_{0.015}Ga_{2.85}Al_{1.9}O_{11.625}$ | 0 | 520 | 1.11 | 1.9 | 85(88)% 160(12)% | 385 |
| Example 8 | $Gd_{2.985}Ce_{0.015}Ga_3Al_2O_{12}$ | Li 300 | 520 | 1.34 | 1.7 | 47(90)% 133(10)% | 235 |
| Example 9 | $Gd_{2.985}Ce_{0.015}Ga_{3.15}Al_{2.1}O_{12.375}$ | 0 | 520 | 1.08 | 1.9 | 86(83)% 188(17)% | 350 |
| Example 10 | $Lu_{2.985}Ce_{0.015}Al_5O_{12}$ | Li 300 | 480 | 1.09 | 1.0 | 44(79)% 154(21)% | 290 |
| Comparative example 5 | $Gd_{2.985}Ce_{0.015}Ga_{3.15}Al_{2.1}O_{12.375}$ | Li 300 | 520 | 0.40 | 3.3 | 114(65)% 1248(35)% | 670 |
| Example 11 | $Lu_{2.985}Ce_{0.015}Al_{5.2}O_{12.3}$ | Mg 300 | 480 | 1.32 | 0.8 | 32(100)% | 240 |
| Example 12 | $Y_{2.985}Ce_{0.015}Al_{5.2}O_{12.3}$ | Mg 300 | 480 | 1.28 | 0.7 | 31(100)% | 230 |
| Example 13 | $Lu_{2.985}Ce_{0.015}Al_{4.78}O_{11.7}$ | Mg 300 | 480 | 1.24 | 0.8 | 33(100)% | 230 |
| Example 14 | $Y_{2.985}Ce_{0.015}Al_{4.8}O_{11.7}$ | Mg 300 | 480 | 1.22 | 0.7 | 32(100)% | 230 |

Figure 1:
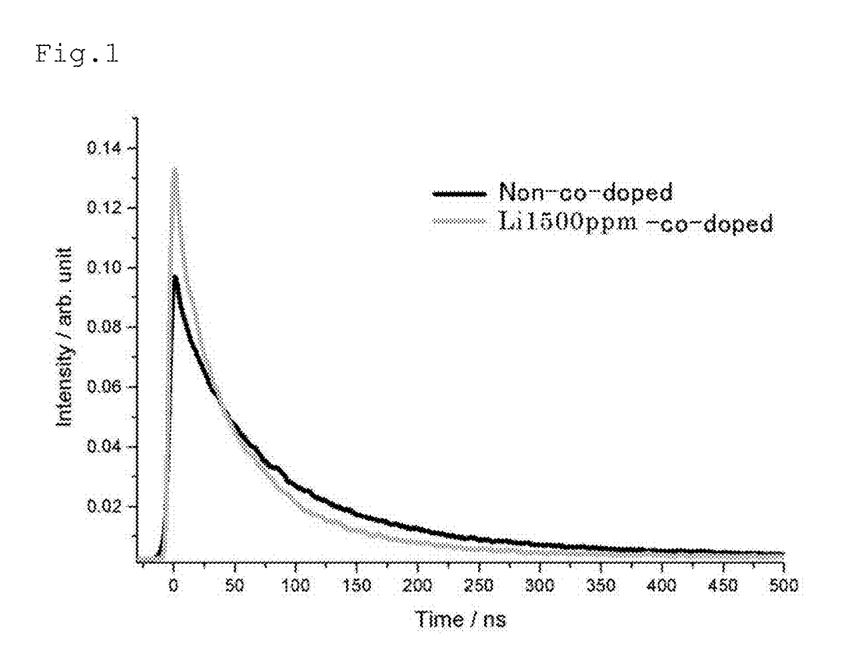
FIG. 1 is a graph showing voltage pulse signals obtained using a digital oscilloscope when an illuminant of an embodiment of the present invention, $Gd_{2.985}Ce_{0.0015}Ga_3Al_2O_{12}$ prepared by co-doping of Li at 1500 ppm, and a crystal not-co-doped with Li were irradiated with a $^{137}Cs$ gamma-ray.

FIG. 1 shows voltage pulse signals obtained using a digital oscilloscope by processing and polishing $Gd_{2.985}Ce_{0.015}Ga_3Al_2O_{12}$ co-doped with Li at 1500 ppm of those in Example 1 and the non-co-doped scintillator single crystal (not co-doped with Li) having the same composition in Comparative example 1 to a size of φ3×1 mm, adhering a crystal piece to a photomultiplier tube using an optical adhesive, covering the top surface with Teflon (Registered trademark) tape, irradiating the top surface with a $^{137}$Cs gamma-ray. The thus obtained voltage pulse signals were analyzed and evaluated for emission intensity, rise time of emission, and fluorescence lifetime. As shown in FIG. 1 and Table 1, as a result of co-doping of Li at 1500 ppm, the emission intensity increased by 21%, and the rise time was shortened by 22% from 2.3 ns (not-co-doped) to 1.8 ns (co-doped at 1500 ppm), compared to the non-co-doped crystal (Comparative example 1). Furthermore, the fluorescence lifetime was shortened by 33% from 64 ns (not-co-doped) to 43 ns (co-doped at 1500 ppm), and the components having long fluorescence lifetimes existing without co-doping decreased. Moreover, X-ray irradiation was performed under conditions of CuKα, 40 mA, and 40 mV, the maximum emission intensity was compared with emission intensity after 1 ms, and then the content of a phosphorescence component was measured. As a result, the content of the phosphorescence component decreased from 1% (not-co-doped) to 0.1% (co-doped at 1500 ppm).

Two scintillator single crystals, the single crystal having a composition of $Gd_{2.985}Ce_{0.015}Ga_3Al_2O_{12}$ prepared by co-doping of Li at 1500 ppm of those in Example 1 and the non-co-doped single crystal of Comparative example 1 having the same composition (not-co-doped with Mg), were measured for time resolution by the above coincidence method. As shown in Table 1, as a result of co-doping of Li at 1500 ppm, the time resolution was improved such that it was shortened from 400 ps (Comparative example 1) to 210 ps (Example 1), compared to the non-co-doped crystal.

Furthermore, as shown in Table 1, when Examples 1 to 3 were compared with Comparative examples 1, 3, and 4, it was confirmed that co-doping of Li resulted in increased emission intensity, shortened rise time of emission and shortened fluorescence lifetime, and the components having long fluorescence lifetimes decreased.

Single crystals of Examples 6 and 7 wherein the value of "y" was represented by 0<y<0.5 or 0<y<−0.5 in general formula $Ce_xRE_{3-x}M_{5+y}O_{12+3y/2}$ and a single crystal having $Gd_{2.985}Ce_{0.015}Ga_3Al_2O_{12}$ (y=0) of Comparative example 1 were irradiated with X-rays under conditions of CuKα, 40 mA, and 40 mV. Maximum emission intensity was compared with emission intensity after 1 ms, and then the content of a phosphorescence component was measured. As a result, the content of the phosphorescence component decreased from 1.8% (comparative example 1) to 0.2% (Example 6) and 0.2% (Example 7). It was confirmed that specifying the value of "y" to be 0<y<0.5 or 0<y<−0.5 in general formula $Ce_xRE_{3-x}M_{5+y}O_{12+3y/2}$ resulted in the decreased content of the phosphorescence component.

A scintillator single crystal having $Gd_{2.985}Ce_{0.015}Ga_3Al_2O_{12}$ co-doped with Li at 1500 ppm of those in Example 1 and a scintillator single crystal of Comparative example 1 having the same composition not-co-doped with Li were processed and polished into a size of φ3×1 mm, and then irradiated with X-rays corresponding to 600 Gy generated under conditions of CuKα, 40 mA, and 40 mV. Next, the rate of increase in absorption coefficient at 520 nm was measured before and after X-ray irradiation. The rate of increase in absorption coefficient of non-co-doped crystal (Comparative example 1) was 50%, and the rate of increase in absorption coefficient of the crystal (Example 1) co-doped with Li at 1500 ppm was 1.0%. It was confirmed that co-doping of Li improved radiation resistance.

Scintillator single crystals of Examples 6 and 7 wherein the value of "y" was represented by 0<y<0.5 or 0<y<−0.5 in general formula $Ce_xRE_{3-x}M_{5+y}O_{12+3y/2}$ and a scintillator single crystal having $Gd_{2.985}Ce_{0.015}Ga_3Al_2O_{12}$ (y=0) of Comparative example 1 were processed and polished into a size of φ3×1 mm, and then irradiated with X-rays corresponding to 600 Gy generated under conditions of CuKα, 40 mA, and 40 mV. When the rate of increase in absorption coefficient was measured at 520 nm before and after X-ray irradiation, the rate of increase in absorption coefficient decreased from 50% (Comparative example 1) to 1.2% (Example 6) and 1.5% (Example 7). It was confirmed that specifying the value of "y" to be 0<y<0.5 or 0<y<−0.5 in general formula $Ce_xRE_{3-x}M_{5+y}O_{12+3y/2}$ improved radiation resistance.

Mg-co-doped scintillator single crystals of Examples 12 and 14 wherein the value of "y" was represented by 0<y<0.5 or 0<y<−0.5 in general formula $Ce_xRE_{3-x}M_{5+y}O_{12+3y/2}$ and a scintillator single crystal having $Y_{2.985}Ce_{0.015}Al_5O_{12}$ (y=0) of Comparative example 4 were processed and polished into a size of φ3×1 mm, and then irradiated with X-rays corresponding to 600 Gy generated under conditions of CuKα, 40 mA, and 40 mV. When the rate of increase in absorption coefficient was measured at 520 nm before and after X-ray irradiation, the rate of increase in absorption coefficient decreased from 55% (Comparative example 4) to 0.5% (Example 6) and 0.8% (Example 7). It was confirmed that specifying the value of "y" to be 0<y<0.5 or 0<y<−0.5 in general formula $Ce_xRE_{3-x}M_{5+y}O_{12+3y/2}$ improved radiation resistance.

Mg-co-doped scintillator single crystals of Examples 11 and 13 wherein the value of "y" was represented by 0<y<0.5 or 0<y<−0.5 in general formula $Ce_xRE_{3-x}M_{5+y}O_{12+3y/2}$ and a scintillator single crystal having $Lu_{2.985}Ce_{0.015}Al_5O_{12}$ (y=0) of Comparative example 3 were processed and polished into a size of φ3×1 mm, and then irradiated with X-rays corresponding to 600 Gy generated under conditions of CuKα, 40 mA, and 40 mV. When the rate of increase in absorption coefficient was measured at 520 nm before and after X-ray irradiation, the rate of increase in absorption coefficient decreased from 55% (Comparative example 4) to 0.8% (Example 6) and 0.9% (Example 7). It was confirmed that specifying the value of "y" to be 0<y<0.5 or 0<y<−0.5 in general formula $Ce_xRE_{3-x}M_{5+y}O_{12+3y/2}$ improved radiation resistance.

Furthermore, as shown in Table 1, light yields, time resolutions, and emission intensity in Examples 6 and 7 wherein the value of "y" was represented by 0<y<0.5 or 0<y<−0.5 in general formula $Ce_xRE_{3-x}M_{5+y}O_{12+3y/2}$, were confirmed to be more improved than those in Comparative example 1 (y=0). Moreover, fluorescence lifetimes in Examples 6 and 7 were confirmed to be shortened and the long-life components were confirmed to decrease, compared to Comparative example 1. This is probably because the anti-site phenomenon involving partial replacement by a rare-earth element in the 6-coordinated site or Al and Ga in the 8-coordinated site was reduced by specifying the value of "y" to be 0<y<0.5 or 0<y<−0.5 in general formula $Ce_xRE_{3-x}M_{5+y}O_{12+3y/2}$, and the defect level resulting from anti-sites decreased, so that $Ce^{3+}$ 4f5d emission was accelerated. Furthermore, such decreased defect level was considered to cause a decrease in absorption associated with the defect level upon radiation, and improve radiation resistance.

Furthermore, as shown in Table 1, the emission intensity was confirmed to increase, the rise time of emission and the fluorescence lifetime were confirmed to be shorter, and the components having long fluorescence lifetimes were confirmed to decrease after annealing in an atmosphere containing oxygen in Example 9 and Example 10, compared to the results obtained before annealing (Example 6 and Example 2, respectively).

Example 15

According to the micro-pulling down method, garnet scintillator single crystals having a composition of $Gd_{2.985}Ce_{0.015}Ga_3Al_2O_{12}$ were prepared by co-doping of Mg at 300, 1500, and 3000 ppm. These single crystals' had a diameter of about 3 mm and a length of about 15 mm, and were yellowish transparent. Emission from the 4f5d level of $Ce^{3+}$ was confirmed at wavelengths in the vicinity of 520 nm. The diffuse transmittance at 520 nm was 91% per cm.

Example 16

According to the micro-pulling down method, garnet scintillator single crystals having a composition of $Gd_{2.985}Ce_{0.015}Ga_3Al_2O_{12}$ were prepared by co-doping of Ca at 300, 1500, and 3000 ppm. The thus obtained single crystals had a diameter of about 3 mm and a length of about 15 mm, and were yellowish transparent. Emission from the 4f5d level of $Ce^{3+}$ was confirmed at wavelengths in the vicinity of 520 nm. The diffuse transmittance at 520 nm was 91% per cm.

Example 17

According to the micro-pulling down method, a garnet scintillator single crystal having a composition of $Gd_{2.985}Ce_{0.015}Ga_3Al_2O_{12}$ was prepared by co-doping of K at 300 ppm. The thus obtained single crystal had a diameter of about 3 mm and a length of about 15 mm, and was transparent. Emission from the 4f5d level of $Ce^{3+}$ was confirmed at wavelengths in the vicinity of 520 nm. The diffuse transmittance at 520 nm was 90% per cm.

Example 18

According to the micro-pulling down method, a garnet scintillator single crystal having a composition of $Gd_{2.985}Ce_{0.015}Ga_3Al_2O_{12}$ was prepared by co-doping of Na at 300 ppm. The thus obtained single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm.

Example 19

According to the micro-pulling down method, garnet scintillator single crystals having a composition of $Lu_{2.885}Gd_{0.1}Ce_{0.015}Al_5O_{12}$ were prepared by co-doping of Mg at 300, 1500, and 3000 ppm. These single crystals had a diameter of about 3 mm and a length of about 15 mm, and were yellowish transparent. Emission from the 4f5d level of $Ce^{3+}$ was confirmed at wavelengths in the vicinity of 480 nm. The diffuse transmittance at 480 nm was 89% per cm.

Comparative Example 6

According to the micro-pulling down method, a non-co-doped garnet scintillator single crystal having a composition of $Gd_{2.985}Ce_{0.015}Ga_3Al_2O_{12}$ was prepared. The thus obtained single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm.

Comparative Example 7

According to the micro-pulling down method, a garnet scintillator single crystal having a composition of $Gd_{2.985}Ce_{0.0015}Ga_3Al_2O_{12}$ was each prepared by co-doping of Ca at 7500 ppm. The thus obtained single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm. Compared to the non-co-doped crystal in Comparative example 1, the emission intensity decreased by 40%.

Comparative Example 8

According to the micro-pulling down method, a non-co-doped garnet scintillator single crystal having a composition of $Lu_{2.885}Gd_{0.1}Ce_{0.015}Al_5O_{12}$ was prepared. This single crystal had a diameter of about 3 mm and a length of about 15 mm, and was yellowish transparent. Emission from the 4f5d level of $Ce^{3+}$ was confirmed at wavelengths in the vicinity of 480 nm. The diffuse transmittance at 480 nm was 90% per cm.

Example 20

According to the micro-pulling down method, a garnet scintillator single crystal having a composition of $Gd_{2.985}Ce_{0.015}Ga_{3.15}Al_{2.1}O_{12.375}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 92% per cm.

Example 21

According to the micro-pulling down method, a garnet scintillator single crystal having a composition of $Gd_{2.985}Ce_{0.015}Ga_{2.85}Al_{1.9}O_{11.625}$ was prepared by co-doping of Mg at 300 ppm. This single crystal had a diameter of about 3 mm and a length of about 15 mm, and was yellowish transparent. Emission from the 4f5d level of $Ce^{3+}$ was confirmed at wavelengths in the vicinity of 520 nm. The diffuse transmittance at 520 nm was 91% per cm.

Example 22

$Gd_{2.985}Ce_{0.015}Ga_3Al_2O_{12}$ co-doped with Mg at 300 ppm of those in Example 15 was subjected to 24 hours of annealing in an argon atmosphere containing 3% oxygen within a temperature range of 1600° C.

Example 23

$Lu_{2.885}Gd_{0.1}Ce_{0.015}Al_5O_{12}$ co-doped with Mg at 300 ppm of those in Example 19 was subjected to 24 hours of annealing in air within a temperature range of 1200° C.

Comparative Example 9

$Gd_{2.985}Ce_{0.015}Ga_3Al_2O_{12}$ co-doped with Mg at 300 ppm of those in Example 15 was subjected to 24 hours of annealing in an argon atmosphere containing 3% hydrogen within a temperature range of 1000° C.

Table 2 shows the results of evaluating crystals obtained in Examples 15 to 23 and Comparative examples 6 to 9 for emission intensity, light yield, rise time of emission, fluorescence lifetime, and time resolution. Light yields were evaluated by processing and polishing the scintillator single crystals of examples and comparative examples to a size of ϕ3×1 mm, adhering each crystal piece to a photomultiplier tube using an optical adhesive, covering the top surface of which with Teflon (Trademark) tape, irradiating the surface with a $^{137}$Cs gamma-ray, and then analyzing a photoelectric absorption peak of the thus obtained energy spectrum.

Two scintillator single crystals, the single crystal having a composition of $Gd_{2.985}Ce_{0.0015}Ga_3Al_2O_{12}$ prepared by co-doping of Mg at 1500 ppm of those in Example 15 and the non-co-doped single crystal having the same composition (not-co-doped with Mg) in Comparative example 6, were measured for time resolution by the above coincidence method. As shown in Table 2, co-doping of Mg at 1500 ppm resulted in improved time resolution, and the time resolution shortened from 400 ps (Comparative example 6) to 170 ps (Example 15), compared to the non-co-doped crystal.

Furthermore, as shown in Table 2, when Examples 15 and 17 were compared with Comparative examples 6 and 8, co-doping of a monovalent alkali metal ion or a divalent

TABLE 2

| | Host crystal composition | Co-doping level/ppm | Peak emission wavelength/nm | Emission intensity ratio for non-co-doped crystal | Light yield Photons/MeV | Rise time of emission/ns | Fluorescence lifetime/ns | Time resolution |
|---|---|---|---|---|---|---|---|---|
| Example 15 | $Gd_{2.985}Ce_{0.015}Ga_3Al_2O_{12}$ | Mg 300 | 520 | 1.25 | 48000 | 2.0 | 40(95)% 120(5)% | 180 |
| | | Mg 1500 | 520 | 1.29 | 46000 | 1.8 | 39(100)% | 170 |
| | | Mg 3000 | 520 | 1.32 | 42000 | 1.8 | 39(100)% | 160 |
| Example 16 | $Gd_{2.985}Ce_{0.015}Ga_3Al_2O_{12}$ | Ca 300 | 520 | 1.10 | 36000 | 1.9 | 41(87)% 135(13)% | 180 |
| | | Ca 1500 | 520 | 1.20 | 32000 | 1.8 | 39(100)% | 190 |
| | | Ca 3000 | 520 | 1.20 | 30000 | 1.7 | 37(100)% | 200 |
| Example 17 | $Gd_{2.985}Ce_{0.015}Ga_3Al_2O_{12}$ | K300 | 520 | 1.05 | 46000 | 2.1 | 55(86)% 225(14)% | 240 |
| Example 18 | $Gd_{2.985}Ce_{0.015}Ga_3Al_2O_{12}$ | Na 300 | 520 | 1.05 | 46000 | 2.1 | 54(85)% 198(15)% | 240 |
| Comparative example 6 | $Gd_{2.985}Ce_{0.015}Ga_3Al_2O_{12}$ | 0 | 520 | 1.00 | 50000 | 2.3 | 60(80)% 254(20)% | 400 |
| Comparative example 7 | $Gd_{2.985}Ce_{0.015}Ga_3Al_2O_{12}$ | Ca 7500 | 520 | 0.60 | 20000 | 1.8 | 40(100)% | 250 |
| Example 19 | $Lu_{2.885}Gd_{0.1}Ce_{0.015}Al_5O_{12}$ | Mg 300 | 480 | 2.30 | 30000 | 2.5 | 46(96)% 115(4)% | 220 |
| | | Mg 1500 | 480 | 4.90 | 28000 | 2.3 | 48(100)% | 230 |
| | | Mg 3000 | 480 | 4.50 | 25000 | 2.2 | 47(100)% | 220 |
| Comparative example 8 | $Lu_{2.885}Gd_{0.1}Ce_{0.015}Al_5O_{12}$ | 0 | 480 | 1.00 | 22000 | 4.4 | 58(72)% 334(28)% | 240 |
| Example 20 | $Gd_{2.985}Ce_{0.015}Ga_{3.15}Al_{2.1}O_{12.375}$ | Mg 300 | 520 | 1.31 | 50000 | 2.0 | 39(95)% 99(5)% | 170 |
| Example 21 | $Gd_{2.985}Ce_{0.015}Ga_{2.85}Al_{1.9}O_{11.625}$ | Mg 300 | 520 | 1.29 | 49000 | 2.0 | 40(97)% 110(3)% | 175 |
| Example 22 | $Gd_{2.985}Ce_{0.015}Ga_3Al_2O_{12}$ | Mg 300 | 520 | 1.35 | 50000 | 1.9 | 40(96)% 102(5)% | 175 |
| Example 23 | $Lu_{2.885}Gd_{0.1}Ce_{0.015}Al_5O_{12}$ | Mg 300 | 480 | 3.30 | 32000 | 1.8 | 43(97)% 110(3)% | 215 |
| Comparative example 9 | $Gd_{2.985}Ce_{0.015}Ga_3Al_2O_{12}$ | Mg 300 | 520 | 0.60 | 24000 | 2.9 | 70(60)% 2500(40)% | 580 |

Figure 2:
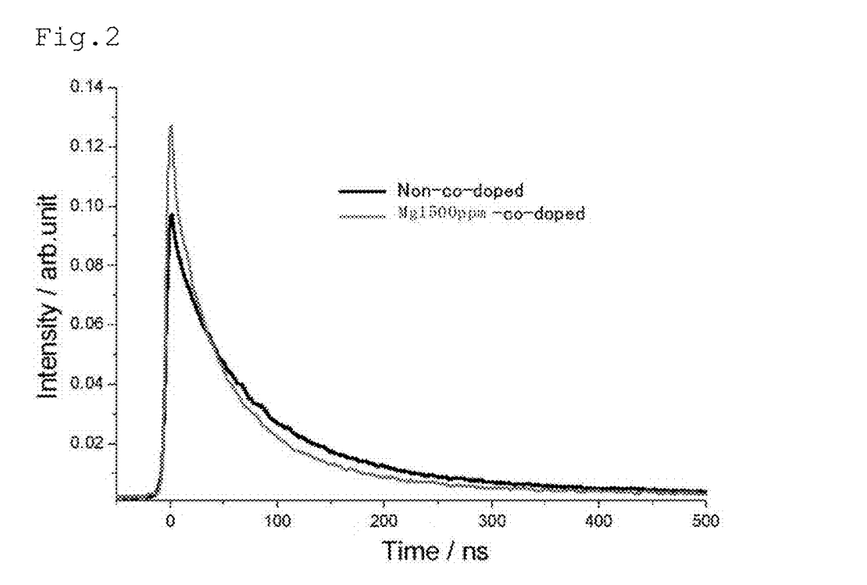
FIG. 2 is a graph showing voltage pulse signals obtained using a digital oscilloscope when an illuminant of an embodiment of the present invention, $Gd_{2.985}Ce_{0.0015}Ga_3Al_2O_{12}$ prepared by co-doping of Mg at 1500 ppm and a crystal not-co-doped with Mg were irradiated with a $^{137}Cs$ gamma-ray.

FIG. 2 shows voltage pulse signals obtained using a digital oscilloscope by processing and polishing $Gd_{2.985}Ce_{0.0015}Ga_3Al_2O_{12}$ co-doped with Mg at 1500 ppm of those in Example 15 and the non-co-doped scintillator single crystal (not co-doped with Mg) having the same composition in Comparative example 6 to a size of ϕ3×1 mm, adhering a crystal piece to a photomultiplier tube using an optical adhesive, covering the top surface with Teflon (Registered trademark) tape, irradiating the top surface with a $^{137}$Cs gamma-ray. The thus obtained voltage pulse signals were analyzed and evaluated for emission intensity, rise time of emission, and fluorescence lifetime. As shown in FIG. 2 and Table 2, co-doping of Mg at 1500 ppm resulted in emission intensity increased by 30%, and rise time shortened by 22% from 2.3 ns (not-co-doped) to 1.8 ns (co-doped at 1500 ppm), compared to the non-co-doped crystal (Comparative example 6). Furthermore, the fluorescence lifetime was shortened by 35% from 60 ns (not-co-doped) to 39 ns (co-doped at 1500 ppm), and the components having long fluorescence lifetimes existing without co-doping decreased.

alkaline-earth metal ion was confirmed to increase the emission intensity, to lower the rise time of emission and to shorten the fluorescence lifetime, and to decrease the components having long fluorescence lifetimes.

Furthermore, as shown in Table 2, when Example 20 and Example 21 wherein the value of "y" was represented by 0<y<0.5 or 0<y<−0.5 in general formula $Gd_{3-x-z}Ce_xR_zM_{5+y}O_{12+3y/2}$, were compared with Example 15 (y=0), it was confirmed that the light yield, the time resolution, and the emission intensity were improved, the fluorescence lifetime was shortened, and the long-life components decreased. Furthermore, it was confirmed that the emission intensity increased, the rise time of emission and the fluorescence lifetime were shortened, and the components having long fluorescence lifetimes decreased after annealing in an atmosphere containing oxygen in Example 22 and Example 23, compared to the results obtained before annealing (Example 15 and Example 19, respectively).

Example 24

Figure 3:
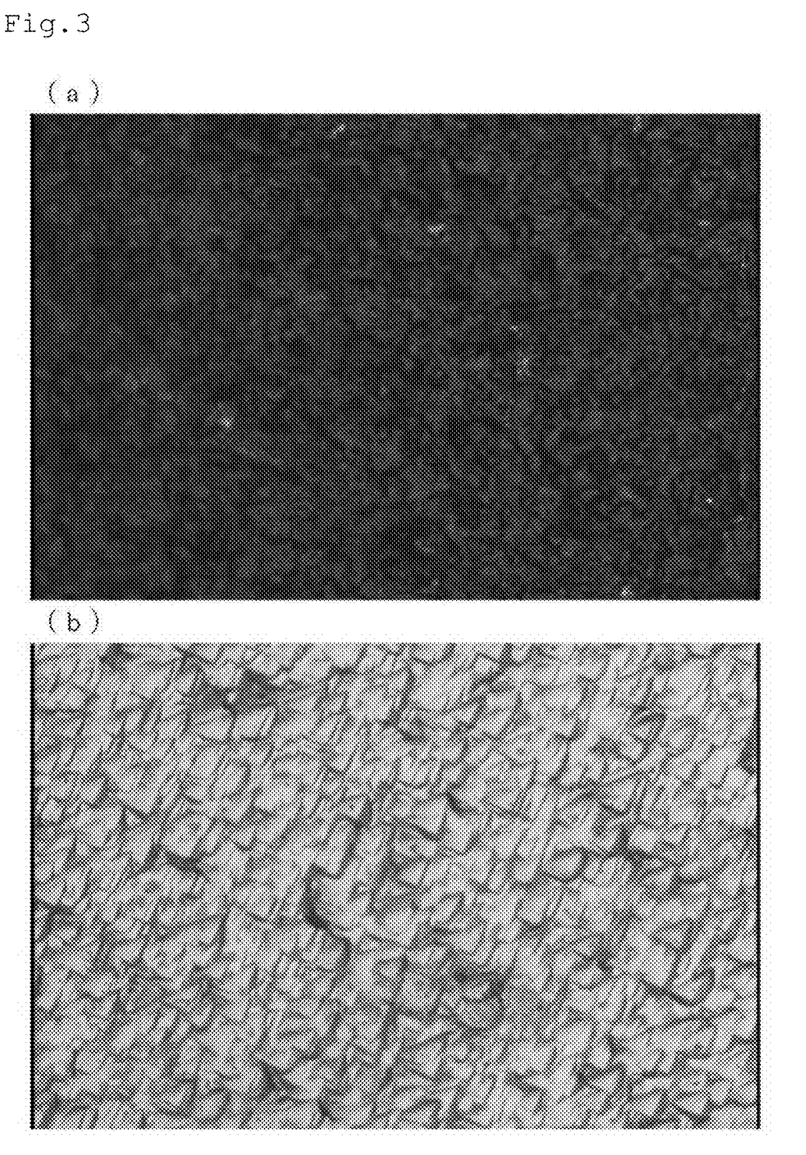
FIG. 3 shows (a) an optical microscopic photograph of the surface of a crystal after etching treatment of an illuminant of an embodiment of the present invention, $Gd_{2.985}Ce_{0.0015}Ga_3Al_2O_{12}$ prepared by co-doping of Mg at 300 ppm, and (b) an optical microscopic photograph of the surface of the crystal before etching treatment.

First, commercially available orthophosphoric acid ($H_3PO_4$) was mixed with sulfuric acid ($H_2SO_4$) at 5%-95% (capacity), and then the solution was heated to 200° C. It was considered that orthophosphoric acid was mainly altered to pyrophosphoric acid ($H_4P_2O_7$) by heating. Subsequently, the temperature of the solution after heating was maintained at an appropriate temperature range of 150° C.-350° C., so that an etchant was prepared. $Gd_{2.985}Ce_{0.0015}Ga_3Al_2O_{12}$ co-doped with Mg at 300 ppm of those in Example 15 was cut using a diamond cutter with a peripheral cutting edge into a size of ϕ3×3 mm$^3$ and then immersed in the above etchant for etching treatment. FIG. 3 shows optical microscopic photographs showing a mirror surface before etching and the same after etching, respectively. As shown in FIG. 3, it was confirmed that etch pits appeared on the surface as a result of etching treatment, and a non-glossy surface was obtained.

Comparative Example 10

$Gd_{2.985}Ce_{0.015}Ga_3Al_2O_{12}$ co-doped with Mg at 300 ppm of those in Example 15 was cut using a diamond cutter with a peripheral cutting edge into a size of ϕ3×3 mm$^3$, and then mirror polishing was performed by a mechanical polishing method.

Comparative Example 11

$Gd_{2.985}Ce_{0.015}Ga_3Al_2O_{12}$ co-doped with Mg at 300 ppm of those in Example 15 was cut using a diamond cutter with a peripheral cutting edge into a size of ϕ3×3 mm$^3$.

Table 3 shows the results of measuring the crystals of Example 24, Comparative example 10 and Comparative example 11 for scintillator performance, and evaluating the crystals for emission intensity ratio, light yield, time resolution, and normal incidence reflectivity. As shown in Table 3, the single crystal (Example 24) subjected to etching treatment was confirmed to exhibit scintillation characteristics equivalent to or better than those of the single crystals (Comparative examples 10 and 11) obtained by a conventional machining method.

TABLE 3

|  | Emission intensity ratio | Light yield Photon/MeV | Time resolution/ps | Normal incidence reflectivity/% |
|---|---|---|---|---|
| Comparative example 10 | 1.00 | 42000 | 230 | 7.1 ± 0.1 |
| Comparative example 11 | 0.7 | 30000 | 280 | 0.1 ± 0.1 |
| Example 24 | 1.25 | 52000 | 190 | 0.5 ± 0.1 |

The invention claimed is:

1. An illuminant, including a garnet illuminant prepared by co-doping of at least one type of monovalent or divalent cation at a molar ratio of 7000 ppm or less with respect to all cations, to an illuminant having a garnet structure represented by general formula $Ce_xRE_{3-x}M_{5+y}O_{12+3y/2}$, where:
   $0.0001 \le x \le 0.3$,
   $0 < y \le 0.5$,
   M is one type or two or more types selected from the group consisting of Al, Lu, Ga, and Sc, and
   RE is one type or two or more types selected from the group consisting of La, Pr, Gd, Tb, Yb, Y, and Lu.

2. The illuminant according to claim 1, comprising a transparent body that is obtained by heating a raw material at 1000° C. or higher, has a light yield of 20000 photons/MeV or more and a time resolution of 300 ps or less, contains a 0.5% or less phosphorescence component, and has a diffuse transmittance of 80% or more.

3. An illuminant, which is produced by annealing the illuminant according to claim 1, at 1000° C. or higher in an atmosphere containing oxygen or an inert gas atmosphere.

4. The illuminant according to claim 1, which has etch pits on a surface as a result of etching treatment involving immersion in an etchant containing phosphoric acid, and has a nonglossy surface having normal incidence reflectivity of 8.5% or less.

5. The illuminant according to claim 1, which is a single crystal.

6. A radiation detector, having an illuminant that absorbs radiation such as γ-rays, X-rays, α-rays, and neutron rays and high energy photons and emits light, and a photoreceiver that detects the emission from the illuminant, wherein said illuminant is the illuminant according to claim 1.

7. An illuminant, including a garnet illuminant prepared by co-doping of Li at a molar ratio of 7000 ppm or less with respect to all cations, to an illuminant having a garnet structure represented by general formula $Ce_xRE_{3-x}M_{5+y}O_{12+3y/2}$, where:
   $0.0001 \le x \le 0.3$,
   $0 < y \le 0.5$,
   M is one type or two or more types selected from the group consisting of Al, Lu, Ga, and Sc, and
   RE is one type or two or more types selected from the group consisting of La, Pr, Gd, Tb, Yb, Y, and Lu.

8. An illuminant, including a garnet illuminant prepared by co-doping of Mg at a molar ratio of 7000 ppm or less with respect to all cations, to an illuminant having a garnet structure represented by general formula $Ce_xRE_{3-x}Al_{5+y}O_{12+3y/2}$, where:
   $0.0001 \le x \le 0.3$,
   $0 < y \le 0.5$, and
   RE is one type or two or more types selected from the group consisting of Y and Lu.

9. An illuminant, including a garnet illuminant prepared by co-doping of Li or Mg at a molar ratio of 7000 ppm or less with respect to all cations, to an illuminant having a garnet structure represented by general formula $Ce_xGd_{3-x}(Ga_zAl_{1-z})_{5+y}O_{12+3y/2}$, where:
   $0.0001 \le x \le 0.3$,
   $0 < y \le 0.5$, and
   $0.49 \le z \le 0.7$.

10. An illuminant, including a garnet illuminant prepared by co-doping of at least one type of monovalent or divalent cation at a molar ratio of 7000 ppm or less with respect to all cations, to an illuminant having a garnet structure represented by general formula $Gd_{3-x-z}Ce_xRE_zM_{5+y}O_{12+3y/2}$, where:
   $0.0001 \le x \le 0.1$,
   $0 < y \le 0.5$, $0 \le z < 3$,
   M is one type or two or more types selected from the group consisting of Al, Lu, Ga, and Sc, and
   RE is one type or two or more types selected from the group consisting of La, Pr, Tb, Yb, Y, and Lu.

11. An illuminant, having a garnet structure represented by general formula $Ce_xRE_{3-x}M_{5+y}O_{12+3y/2}$, where:
   $0.0001 \le x \le 0.3$,
   $0 < y \le 0.5$,
   M is one type or two or more types selected from the group consisting of Al, Lu, Ga, and Sc, and RE is one type or two or more types selected from the group consisting of La, Pr, Gd, Tb, Yb, Y, and Lu.

* * * * *